United States Patent
Walker et al.

(10) Patent No.: US 7,667,241 B1
(45) Date of Patent: Feb. 23, 2010

(54) ELECTROSTATIC DISCHARGE PROTECTION DEVICE

(75) Inventors: Andrew Walker, Mountain View, CA (US); Helmut Puchner, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 20 days.

(21) Appl. No.: 11/860,990

(22) Filed: Sep. 25, 2007

Related U.S. Application Data

(60) Provisional application No. 60/826,991, filed on Sep. 26, 2006.

(51) Int. Cl.
*H01L 29/74* (2006.01)

(52) U.S. Cl. .................. 257/107; 257/122; 257/141; 257/162; 257/173; 257/175; 257/353; 257/355; 257/E29.225

(58) Field of Classification Search .................. 257/107, 257/173, 355, E29.225, 353, 122, 141, 162, 257/175
See application file for complete search history.

(56) References Cited

U.S. PATENT DOCUMENTS

| | | |
|---|---|---|
| 5,182,220 A | 1/1993 | Ker et al. |
| 5,719,733 A | 2/1998 | Wei et al. |
| 5,754,380 A | 5/1998 | Ker et al. |
| 5,825,600 A | 10/1998 | Watt |
| 6,086,879 A | 7/2000 | Mowbray et al. |
| 6,169,309 B1 | 1/2001 | Teggatz et al. |
| 6,365,940 B1 | 4/2002 | Duvvury et al. |
| 6,433,368 B1 | 8/2002 | Vashchenko et al. |
| 6,548,874 B1 | 4/2003 | Efland et al. |
| 6,576,934 B2 | 6/2003 | Cheng et al. |
| 6,639,284 B1 * | 10/2003 | Chatterjee et al. ........... 257/355 |
| 6,696,708 B2 | 2/2004 | Hou et al. |
| 6,924,531 B2 | 8/2005 | Chen et al. |
| 2002/0081783 A1 | 6/2002 | Lee et al. |
| 2004/0004231 A1 | 1/2004 | Peng et al. |
| 2004/0033666 A1 * | 2/2004 | Williams et al. ............ 438/297 |
| 2005/0151160 A1 * | 7/2005 | Salcedo et al. .............. 257/173 |
| 2005/0174142 A1 | 8/2005 | Jeon et al. |
| 2005/0254189 A1 | 11/2005 | Wu et al. |
| 2006/0006462 A1 | 1/2006 | Chang et al. |

(Continued)

OTHER PUBLICATIONS

A.J. Walter, S.T. Ward and H. Puchner "Novel Robust High Voltage ESD Clamps for LDMOS Protection", Cypress Semiconductor, IEEE 07CH37867 45th Annual International Reliability Physics Symposiums, 2007.*

(Continued)

*Primary Examiner*—Long K Tran

(57) ABSTRACT

An electrostatic discharge protection device for protecting a node includes a transistor, a silicon controlled rectifier, a second contact region laterally displaced from the first contact region, and a collection region adjacent the source region. The transistor includes a semiconductor substrate, a source region, a channel region adjacent the source region, a gate over the channel region, and a drain region laterally displaced from the channel. The silicon controlled rectifier includes the source region, a portion of the substrate, a doped well, and a first contact region in the well, laterally displaced from the drain region. The collection region, the source region and the gate, are metallically connected. The node, the first contact region, and the second contact region, are metallically connected, and the drain region is not metallically connected to the node.

19 Claims, 3 Drawing Sheets

U.S. PATENT DOCUMENTS

2006/0274465 A1  12/2006  Wu et al.

OTHER PUBLICATIONS

Chung, Y. et al., "Snapback breakdown dynamics and ESD susceptibility of LDMOS", 44$^{th}$ Annual International Reliability Physics Symposium, San Jose, pp. 352-355, (2006).

Duvvury, C. et al., "Efficient NPN operation in high voltage NMOSFET for ESD robustness", IEDM, pp. 345-348, (1995).

Duvvury, C. et al., "Lateral DMOS design for ESD robustness", IEDM, pp. 375-378, (1997).

Duvvury, C. et al., "Device integration for ESD robustness of high voltage power MOSFETs", IEDM, pp. 407-410, (1994).

Encyclopedia of Chemical Technology, Kirk-Othmer, vol. 14, pp. 677-709, (1995).

Kawamoto, K. et al., "A no-snapback LDMOSFET with automotive ESD endurance", IEEE Transactions on Electron Devices, vol. 49, No. 11, pp. 2047-2053, (2002).

Lee, J-H. et al., "Novel ESD protection structure with embedded SCR LDMOS for smart power technology", 40$^{th}$ Annual International Reliability Physics Symposium, Dallas, Texas, pp. 156-161, (2002).

Mergens, M.P.J. et al., "Analysis of lateral DMOS power devices under ESD stress conditions", IEEE Transactions on Electron Devices, vol. 47, No. 11, pp. 2128-2137, (2000).

USPTO Final Rejection for 11/234,255, dated Jan. 8, 2009, 10 pages.

USPTO Non-Final Rejection for 11/234,255, dated Mar. 4, 2008, 10 pages.

USPTO Non-Final Rejection for 11/234,255, dated Aug. 27, 2007, 12 pages.

Utility Application of Specifications for 11/234,255, dated Sep. 23, 2005, 22 pages.

Utility Application of Claims for 11/234,255, dated Sep. 23, 2005, 5 pages.

Utility Application of Abstract for 11/234,255, dated Sep. 23, 2005, 1 page.

Utility Application of Drawings for 11/234,255, dated Sep. 23, 2005, 2 pages.

USPTO Final Rejection for U.S. Appl. No. 11/234,255 (PM05025) dated Apr. 23, 2009; 14 pages.

USPTO Requirement for Restriction/Election for U.S. Appl. No. 11/234,255 (PM05025) dated Sep. 3, 2008; 7 pages.

USPTO Requirement for Restriction/Election for U.S. Appl. No. 11/234,255 (PM05025) dated Jul. 5, 2007; 6 pages.

Walker et al., "Novel Robust ESD Clamps for LDMOS Protection," Cypress Semiconductor; 3 pages; Apr. 15, 2007.

* cited by examiner

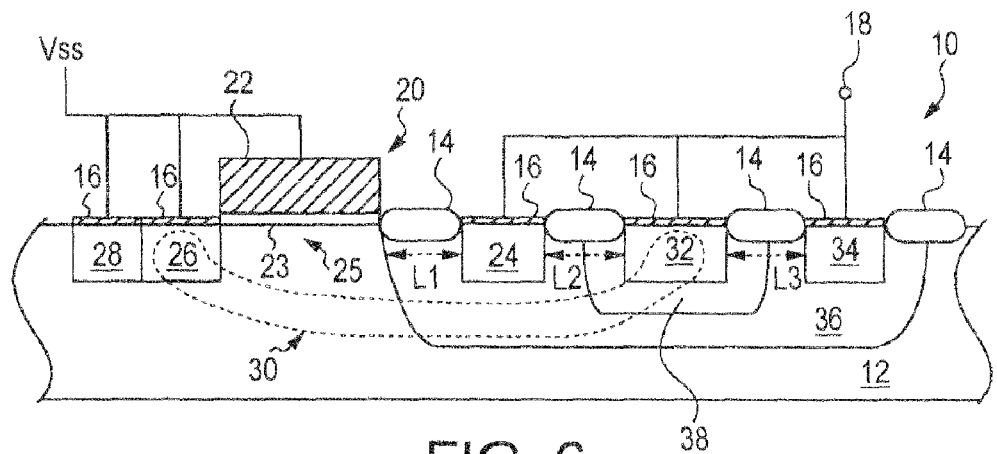
PRIOR ART  FIG. 6
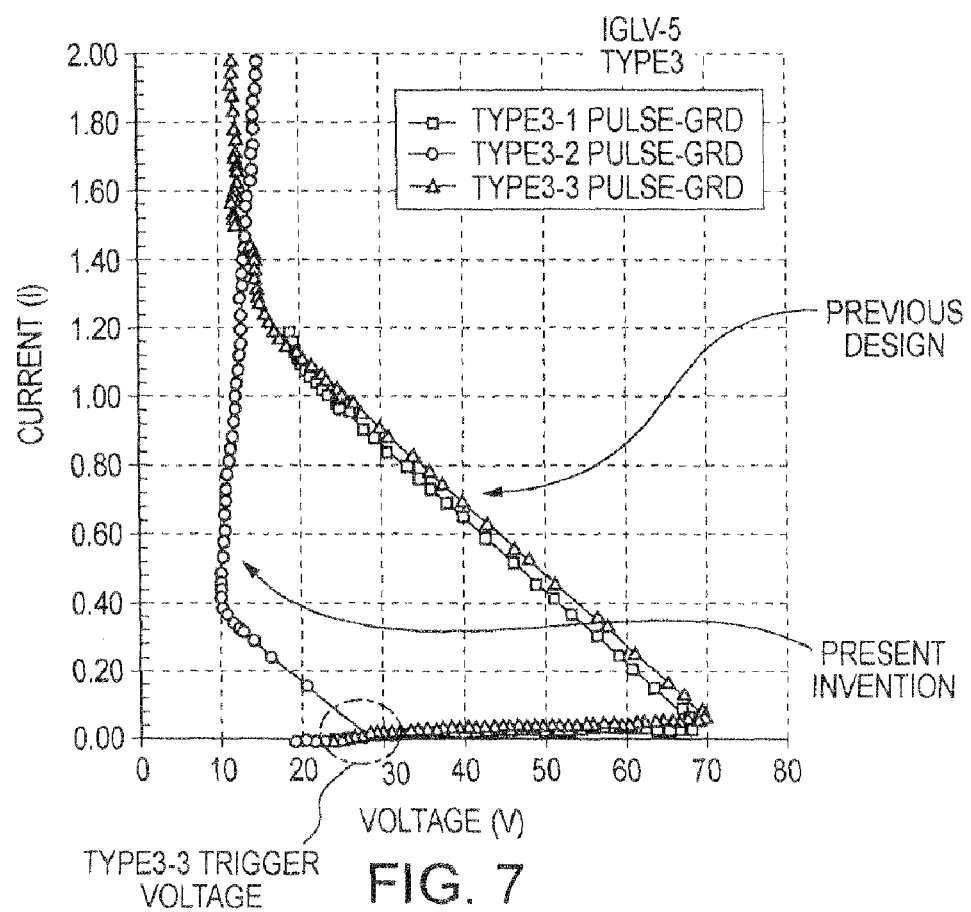
FIG. 7

ELECTROSTATIC DISCHARGE PROTECTION DEVICE

CROSS-REFERENCE TO RELATED APPLICATION

This application claims priority to provisional application No. 60/826,991 entitled "FAST TRIGGERED SCR ESD CLAMP" filed 26 Sep. 2006, the entire contents of which are hereby incorporated by reference, except where inconsistent with the present application.

BACKGROUND

Integrated circuit devices are susceptible to damage from application of excessive voltages, such as, for example, electrostatic discharge (ESD) events. In particular, during an ESD event, charge transferred within a circuit can develop voltages that are large enough to break down insulating films (e.g., gate oxides) on the device or dissipate sufficient energy to cause electrothermal failures in the device. Such failures include contact spiking, silicon melting, or metal interconnect melting. As such, protection circuits are often connected to I/O bonding pads of an integrated circuit to safely dissipate energy associated with ESD events away from active circuitry. Protection circuits may also be connected to power supply pads or between power supply buses to prevent damage to active circuitry. In developing effective ESD protection circuitry, circuit designers may, however, be limited with regard to the particular structures used, since the protection circuit must integrate well with the remainder of the integrated circuit. For instance, integrated circuits which operate with applications of high voltages (i.e., $V_{DD}$>12 volts) generally need protection circuitry configured to accommodate high voltage levels.

A transistor structure often used for high voltage applications is a drain extended metal oxide semiconductor (DEMOS) transistor, which may also be referred to in the microelectronics industry as a laterally diffused metal oxide semiconductor (LDMOS) transistor. DEMOS transistors differ from other MOS transistors in that the drain contact region is laterally displaced apart from the channel of the transistor at a greater distance than the source contact region of the transistor. As a consequence of the additional voltage drop in the drain extension region, the voltage across the channel of the DEMOS transistor is lower than a transistor having a drain contact region closer to the channel and, in turn, the electric field across the gate oxide is lower. Although DEMOS transistors are effective for operations at high voltage levels, DEMOS transistors are inherently susceptible to damage from ESD events due to their device structure.

One approach in providing ESD protection for integrated circuits having DEMOS transistors is to employ a silicon controlled rectifier (SCR) type structure for transferring charge away from the transistor. For example, some conventional designs incorporate SCRs within active DEMOS transistors of an integrated circuit (i.e., transistors used for operations of a device other than protection from ESD events). Such a configuration, however, relies on drain breakdown of the active DEMOS transistor to trigger the SCR. In some cases, triggering the SCR in such a manner may not be fast enough to prevent the active DEMOS transistor from being damaged and, therefore, may not be effective for many applications. In other embodiments, an SCR may be incorporated within protection circuitry coupled to I/O bonding pads of an integrated circuit. In some cases, a protection-designated DEMOS transistor may further be included in the protection circuitry to trigger the SCR. In general, however, such configurations have limited controllability of the trigger and holding voltages of the SCR. As a consequence, the level of ESD protection offered by such designs is limited.

SUMMARY

In a first aspect, the present invention is an electrostatic discharge protection device for protecting a node, comprising (a) a transistor, comprising (i) a semiconductor substrate, (ii) a source region, in the substrate, (iii) a channel region, in the substrate, adjacent the source region (iii) a gate, over the channel region, and (iv) a drain region, in the substrate, laterally displaced from the channel; (b) a silicon controlled rectifier, in the substrate, comprising (i) the source region, (ii') a portion of the substrate, (iii') a doped well, in the substrate, and (iv') a first contact region, in the well, laterally displaced from the drain region; (c) a second contact region, in the substrate, laterally displaced from the first contact region, and (d) a collection region, in the substrate, adjacent the source region. The collection region, the source region and the gate, are metallically connected. The node, the first contact region, and the second contact region, are metallically connected, and the drain region is not metallically connected to the node.

In a second aspect, the present invention is an electrostatic discharge protection device for protecting a node, comprising (a) a transistor, comprising (i) a semiconductor substrate, (ii) a source region, in the substrate, (iii) a channel region, in the substrate, adjacent the source region (iii) a gate, over the channel region, and (iv) a drain region, in the substrate, laterally displaced from the channel; (b) a silicon controlled rectifier, in the substrate, comprising (i) the source region, (ii') a portion of the substrate, (iii') a doped well, in the substrate, and (iv') a first contact region, in the well, laterally displaced from the drain region; (c) a second contact region, in the substrate, laterally displaced from the first contact region, and (d) a collection region, in the substrate, adjacent the source region. The collection region, the source region and the gate, are metallically connected. The node, the first contact region, and the second contact region, are metallically connected, and the drain region is not metallically connected to the node. The drain region is laterally displaced from the channel by a distance of 1 to 3 microns, the first contact region is laterally displaced from the drain region by a distance of 1 to 3 microns, and the second contact region is laterally displaced from the first contact region by a distance of 1 to 3 microns.

BRIEF DESCRIPTION OF THE DRAWINGS

FIG. 6 is a cross-sectional view of a previous design ESD protection device.

FIG. 7 is a graph comparing the transmission line pulsing characteristics of the semiconductor structure for ESD protection illustrated in FIG. 6 (Previous design) and the semiconductor structure for ESD protection illustrated in FIG. 1 (Present invention).

DETAILED DESCRIPTION

Figure 1:
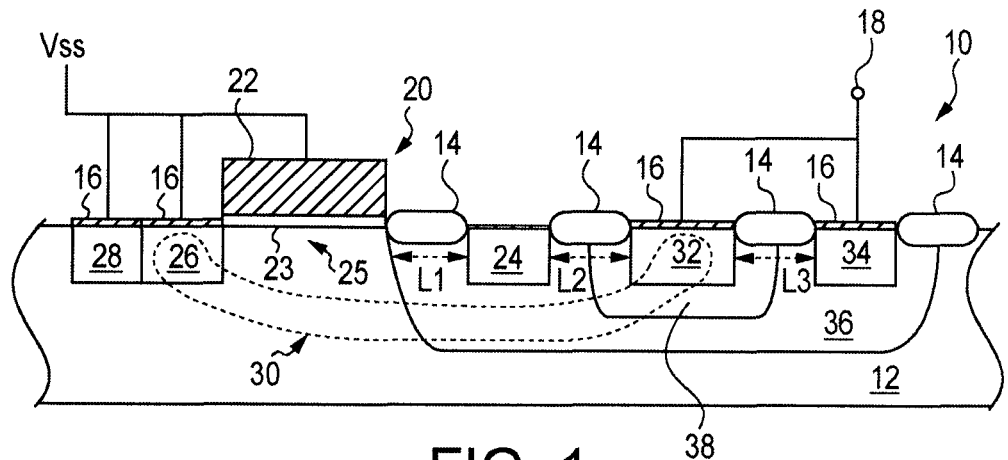
FIG. 1 is a cross-sectional view of a semiconductor structure for electrostatic discharge (ESD) protection.

U.S. patent application Ser. No. 11/234,255 entitled "CIRCUITS PROVIDING ESD PROTECTION TO HIGH VOLTAGE LATERALLY DIFFUSED METAL OXIDE SEMICONDUCTOR (LDMOS) TRANSISTORS" filed Sep. 23, 2005, describes an ESD protection device (hereinafter referred to as "previous design ESD protection device") suitable for use with an integrated circuit using high voltage drain extended MOS transistors. The previous design ESD protection device allows the trigger voltage of an incorporated SCR to be set without affecting the operation of the LDMOS which it protects. FIG. 6 illustrates a cross-sectional view of an example of the previous design ESD protection device.

FIG. 6 shows previous design ESD protection device 10 including DEMOS transistor 20, silicon controlled rectifier (SCR) 30, ohmic contact region 34, and collection region 28. The ESD protection device transfers charge from a bus coupled to node 18 to a bus coupled to low power supply Vss. The bus coupled to node 18 is coupled to an active LDMOS transistor of an integrated circuit. Diverting charge from the bus coupled to node 18 prevents excessive charge from accessing the active LDMOS transistor. DEMOS transistor 20 includes gate 22 and gate oxide 23 on semiconductor layer 12. DEMOS transistor 20 further includes drain contact region 24 and source contact region 26 in semiconductor layer 12 on opposing sides of gate 22. Source contact region 26, gate 22, and collection region 28 are coupled to low power supply Vss. In contrast, drain contact region 24 and ohmic contact regions 32 and 34 are coupled to node 18, which in turn is coupled to a bus coupled to a high voltage signal pad or a high voltage power supply.

Many active n-type LDMOS (LDNMOS) output driver transistors used in current applications employ an operating range between approximately 36 volts and approximately 40 volts and a breakdown voltage between approximately 60 volts and approximately 65 volts. Therefore, previous design ESD protection device breaks down between approximately 40 volts and approximately 56 volts. However, this trigger voltage is not low enough to provide a practical device for 16 volt DEMOS technology.

The present invention makes use of the discovery of a self-protecting high voltage ESD clamp including a triggered SCR, that uses the drain N well to trigger the device very efficiently and without damage. The ESD clamp of the present invention can be adjusted, by changing the distance L1 (the distance the drain contact region is from the channel region beneath the gate), to trigger at a voltage of 12-100 volts, preferably at a voltage of at most 20 volts, such as 15-20 volts. The present invention is achieved by changing the previous design ESD protection device, so that the drain contact region has no metallic connection to the ohmic contact regions, and no metallic connection to the protected node. FIG. 7 is a graph comparing the transmission line pulsing characteristics of the semiconductor structure for ESD protection illustrated in FIG. 6 (previous design ESD device) and the semiconductor structure for ESD protection (present invention) as illustrated in FIG. 1.

Exemplary devices for protecting laterally diffused metal oxide semiconductor (LDMOS) transistors from damage caused by electrostatic discharge (ESD) events are illustrated in FIGS. 1-4. More specifically, cross-sectional views of exemplary semiconductor topographies, which are configured to divert charge from a bus coupled to an active LDMOS transistor (for example, a LDMOS pull-down output driver transistor or a LDMOS pull-up output driver transistor), are shown in FIGS. 1-4. In addition, FIG. 5 illustrates a schematic of an exemplary circuit detailing an arrangement of one or more of the semiconductor topographies depicted in FIGS. 1-4 in positions relative to output driver transistors, signal pads, and power supply pads of a circuit. As discussed in reference to FIG. 5, the ESD protection devices described herein are distinct from the active LDMOS transistors they are used to protect and, as such, the protection devices do not rely on the operation or, more specifically, the avalanche of the active LDMOS transistors.

An LDMOS transistor is a MOS transistor having a drain contact region that is laterally displaced apart from the channel of the transistor at a greater distance than the source contact region is relative to channel. Such a configuration may be implemented in a variety of manners, some examples of which are shown and described below in reference to FIGS. 1-4. An LDMOS transistor may be referred to as a drain extended MOS (DEMOS) transistor and, as such, the terms DEMOS and LDMOS are used interchangeably herein.

FIG. 1 illustrates a cross-sectional view of ESD protection device 10 including DEMOS transistor 20, silicon controlled rectifier (SCR) 30, ohmic contact region 34, and collection region 28. The ESD protection device transfers charge from a bus coupled to node 18 to a bus coupled to low power supply Vss. The bus coupled to node 18 is coupled to an active LDMOS transistor of an integrated circuit. Diverting charge from the bus coupled to node 18 will prevent excessive charge from accessing the active LDMOS transistor. Source contact region 26, gate 22, and collection region 28 are coupled to low power supply Vss. Ohmic contact regions 32 and 34 are coupled to node 18, which in turn is coupled to a bus coupled to a signal pad or a power supply. In contrast to the previous design ESD protection device, drain contact region 24 is not coupled to node 18—there is no metallic connection to node 18.

As shown in FIG. 1, DEMOS transistor 20 includes gate 22 and gate oxide 23 on semiconductor layer 12. DEMOS transistor 20 further includes drain contact region 24 and source contact region 26 in semiconductor layer 12 on opposing sides of gate 22. As used herein, the terms "drain contact region" and "source contact region" may generally refer to the diffusion regions within the semiconductor substrate at which contact is made to allow current flow to and from the transistor. In some embodiments, cladding layer 16 may be formed over such regions, as well as over other ohmic contact regions of ESD protection device 10, to improve the electrical conductivity of connections thereto. The DEMOS transistors may include sidewall spacers and/or lightly doped shallow regions extending from gate sidewalls.

Drain contact region 24 and source contact region 26 may each include electrically active dopants opposite in conductivity type to semiconductor layer 12. In other embodiments, drain contact region 24 and source contact region 26 may be of the same conductivity type as semiconductor layer 12, but may be disposed within well regions of opposite conductivity type. In such cases, drain contact region 24 may be further disposed within well region 36 as described in reference to FIGS. 1 and 2. The conductivity type of drain and source contact regions 24 and 26 define the conductivity type of the DEMOS transistor. In particular, n-type drain and source contact regions from an n-type DEMOS (DENMOS) transistor and p-type drain and source contact region form a p-type DEMOS (DEPMOS) transistor. The DEMOS transistor 20 may be of the same conductivity type as the LDMOS transistor it protects from ESD events.

Figure 2:
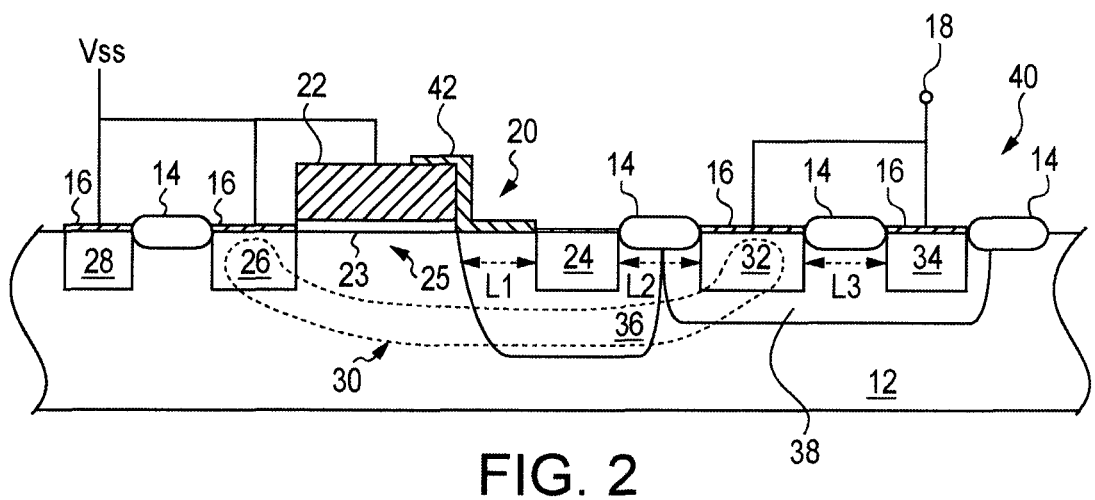
FIG. 2 is a cross-sectional view of alternative semiconductor structure for ESD protection.
Figure 3:
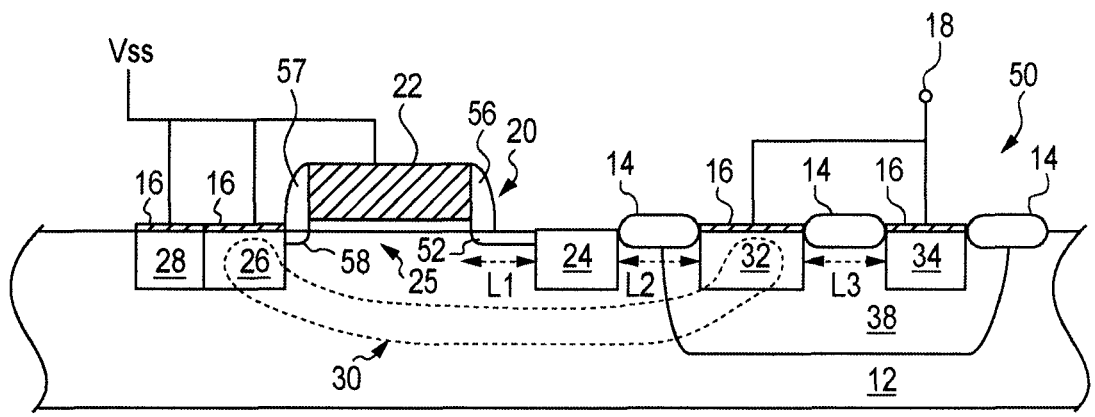
FIG. 3 is a cross-sectional view of another alternative semiconductor structure for ESD protection.

Drain contact region 24 may be laterally displaced away from channel region 25 at a farther distance than source contact region 26 such that a DEMOS transistor is formed. A channel region may generally refer to the region under gate 22 which is of opposite conductivity type from source and drain contact regions 26 and 24 prior to the application of a threshold voltage to gate 22 and is of the same conductivity type as source and drain contact regions 26 and 24 upon application of threshold voltage to gate 22, allowing the conduction of current through the transistor. Drain contact region 24 may be spaced apart from gate 22 by field oxide isolation structure 14 to displace drain contact region 24 farther away from channel region 25 than source contact region 26, as shown in FIG. 1. Field oxide isolation structure 14 may be omitted from ESD protection device 10 and an alternative technique for displacing drain contact region 24 from channel region 25 may be used, such as the use of sidewall spacers or silicide blocking structures along gate 22 as shown in FIGS. 2 and 3. Alternatively, a temporary masking layer may be placed adjacent to gate 22 and dopants may be implanted into the structure so that drain contact region 24 is formed in a designated position relative to gate 22.

In some cases, drain contact region 24 may be in a lightly-doped well region of the same conductivity type, such as well region 36 in FIG. 1. Well region 36 may be fabricated to extend along the sidewalls of gate 22 or beneath a portion of gate 22 to an isolation region on the outlying side of drain contact region 24. Well region 36 may be extended to envelop one or both ohmic contact regions 32 and 34. The breakdown voltage of drain contact region 24 may correspond to the distance the drain contact region is displaced from the channel region beneath gate 22, denoted in FIG. 1 as L1.

An exemplary distance range for L1 to accommodate the breakdown voltages of DEMOS transistor 20 may be between approximately 0.5 micron and approximately 10 microns. In some embodiments, distances between approximately 1.0 micron and approximately 3.0 microns, or more specifically, around 1.5 microns may be applicable for L1.

Spaced adjacent to drain contact region 24 by field oxide isolation structures 14, ESD protection device 10 includes ohmic contact regions 32 and 34. As with drain contact region 24 and source contact region 26, one or both of ohmic contact regions 32 and 34 may include cladding layer 16 thereon to reduce resistance of the connections to the respective power supplies and busses. Ohmic contact region 34 is of the same conductivity type as drain and source contact regions 24 and 26, while ohmic contact region 32 is of the opposite conductivity type.

ESD protection device 10 may include well region 38 surrounding ohmic contact region 32. Well region 38 may be of the opposite conductivity type as ohmic contact region 32 and, thus, may be of the same conductivity type as well region 36. Well region 38, however, may differ from well region 36 by having a greater concentration of impurities, making it slightly more conductive. Alternatively, well region 38 may envelop ohmic contact region 34 in addition or alternative to well region 36. In yet another alternative, well region 38 may be omitted from ESD protection device 10.

Due to the arrangement of ohmic contact region 32 and well region 36, a pnpn junction is formed among ohmic contact region 32, well region 36, semiconductor layer 12, and source contact region 26. More specifically, a first bipolar transistor (either npn or pnp) is formed by source contact region 26 (emitter/collector), semiconductor layer 12 (base), and well region 36 (collector/emitter). In addition, a second bipolar transistor (either pnp or npn) is formed by ohmic contact region 32 (emitter/collector), well region 36 (base), and semiconductor layer 12 (collector/emitter). Collectively, the bipolar transistors serve as silicon controlled rectifier (SCR) 30. In particular, source contact region 26 and ohmic contact region 32 may serve as cathodes and anodes of SCR 30, respectively or vice versa, depending on the conductivity types of the regions formed within ESD protection device 10. The dotted line in FIG. 1 is used to illustrate the general connection of diffusion regions making up SCR 30 and is not intended to imply a particular boundary of the SCR.

The avalanche of drain contact region 24 triggers SCR 30 (i.e., forward bias ohmic contact region 32 to generate charge within semiconductor layer 12). Therefore, not only does the distance between drain contact region 24 and channel region 25, denoted in FIG. 1 as L1, determine the breakdown voltage of drain contact region 24, distance L2 also determines the triggering voltage of SCR 30, both of which may be set by the width of the isolation structure therebetween. In addition, the distance between ohmic contact regions 32 and 34, denoted in FIG. 1 as L3, also affects the triggering voltage of SCR 30.

Another parameter of SCR 30 is its holding voltage. The holding voltage of SCR 30 is affected by the total distance between source contact region 26 and ohmic contact region 32. As noted above, L1 corresponds to the breakdown voltage of DEMOS transistor 20 and, therefore, generally has a width set according to the design specifications of the transistor, as are the widths of source and drain contact regions 26 and 24 and channel region 25. In contrast, the distance between drain contact region 24 and ohmic contact region 32, denoted in FIG. 1 as L2, is not generally set by the operational specifications of the transistor and consequently, L2 may be set to target a particular holding voltage for SCR 30 regardless of the size of DEMOS transistor 20.

As with L1, exemplary distance ranges for L2 and L3 may be between approximately 0.5 micron and approximately 10 microns, depending on the dimensional and doping specifications of ohmic contact regions 32 and 34 and semiconductor layer 12. In some cases, distances between approximately 1.0 micron and approximately 3.0 microns, or more specifically, around 1.5 microns may be particularly applicable for L2 and L3.

The charge injected into semiconductor layer 12 from SCR 30 may be collected at collection region 28, which in turn is coupled to low power supply Vss to dissipate the charge. As with the other contact regions of ESD protection device 10, collection region 28 may include cladding layer 16 to reduce resistance of the connections to Vss. Collection region 28 is of the same conductivity type as ohmic contact region 32 and semiconductor layer 12. In order to generate charge from SCR 30 and pass it to collection region 28, ohmic contact region 32 and collection region 28 may be configured to have relatively high conductivity. Collection region 28 borders source contact region 26 in FIG. 1. Alternatively, collection region 28 may be spaced apart from source contact region 26 by a portion of semiconductor layer 12 and in some cases, may be spaced apart from source contact region 26 by a field oxide isolation structure as shown in FIG. 2.

Figure 4:
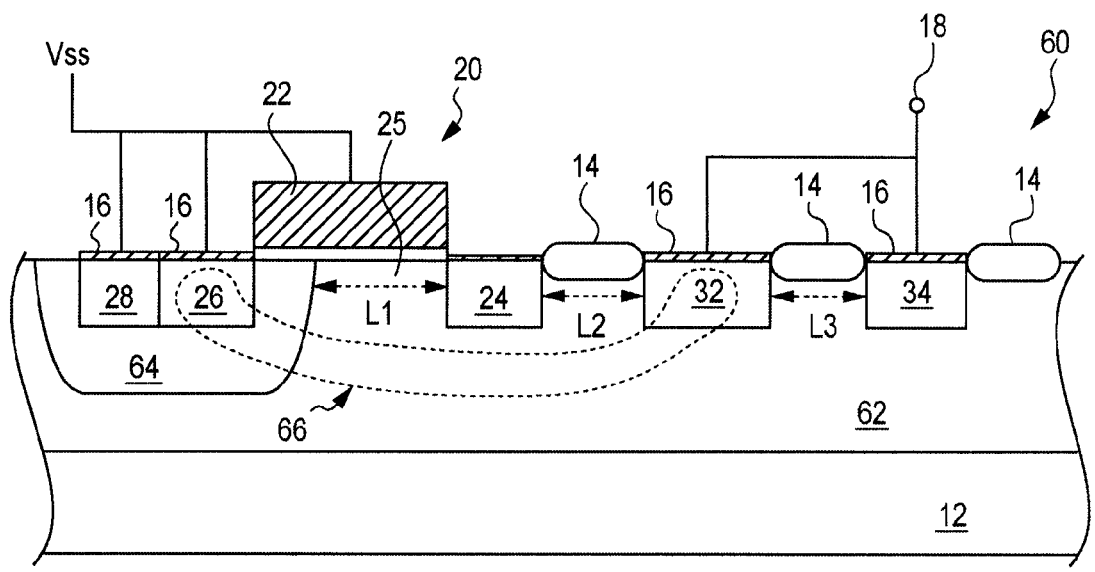
FIG. 4 is a cross-sectional view of yet another alternative semiconductor structure for ESD protection.
Figure 5:
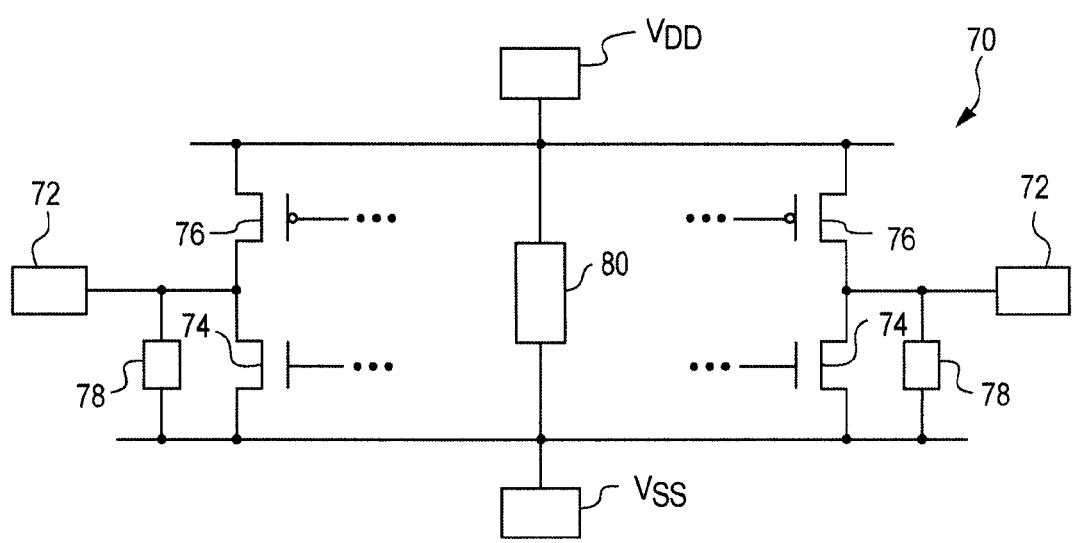
FIG. 5 is a schematic of an exemplary circuit depicting an arrangement of one or more of the semiconductor structures depicted in FIGS. 1-4.

Alternative configurations of ESD protection circuits that are adapted to divert charge from a bus coupled to a LDMOS transistor are shown in FIGS. 2-4. In particular, FIGS. 2-4 illustrate alternative configurations of drain extended MOS transistors which may be configured with a plurality of diffusion regions to form an ESD protection device having an SCR configured to trigger upon avalanche of the corresponding DEMOS transistor. As shown in FIGS. 2-4, ESD protection circuits 40, 50, and 60 may include many of the same components as ESD protection circuit 10 in FIG. 1.

ESD protection circuit 40 in FIG. 2 differs from ESD protection circuit 10 in FIG. 1 by the use of structure 42 along gate 22 and above a portion of well region 36 to extend drain contact region 24 apart from gate 22. Structure 42 includes a dielectric material, such as silicon dioxide or silicon nitride, and in some embodiments, may be used to prevent the formation of silicide structures along gate 22. ESD protection device 40 further differs from ESD protection device 10 in that collection region 28 is spaced apart from source contact region 26 by field oxide isolation structure 14. In addition, well region 36 does not include ohmic contact regions 32 and 34 in ESD protection device 40 and well region 38 is extended to include ohmic contact region 34. The use of structure 42, the alternative placement of collection region 28, the exclusion of ohmic contact regions 32 and 34 within well region 36, and the extension of well region 38 to include ohmic contact region 34 are not mutually exclusive to ESD protection circuit 40 and, therefore, any one or more of such alternative configurations may be incorporated into ESD protection circuit 10.

ESD protection circuit 50 in FIG. 3 differs from ESD protection circuit 10 in FIG. 1 by the exclusion of well region 36 and, instead includes lightly doped shallow region 52 and sidewall spacer 56. ESD protection circuit 50 further includes a lightly doped shallow region 52. Furthermore, ESD protection circuit 50 includes sidewall spacer 57 on the opposing side of gate 22 and also includes lightly doped shallow region 58 displacing source contact region 26 from gate 22. Lightly doped shallow regions 52 and 58 may include substantially similar concentrations of dopants, or lightly doped shallow region 52 may include a smaller concentration of impurities than lightly doped shallow region 58. Any combination of the components described in reference to FIGS. 1-3 may be used to extend a drain contact region from a gate to form a DEMOS transistor. For example, both a silicide blocking structure and a lightly doped shallow region may be used to extend drain contact region 24 from gate 22.

FIG. 4 illustrates ESD protection device 60 including a different configuration of well regions and further illustrates the arrangement of such well regions as well as drain and source contact regions 24 and 26 and ohmic contact regions 32 and 34 within a semiconductor layer of an opposite conductivity type than described in reference to FIGS. 1-3. In particular, FIG. 4 illustrates ESD protection device 60 including semiconductor layer 62 arranged above semiconductor layer 12 and doped of the same conductivity type as drain and source contact regions 24 and 26 as well as ohmic contact region 34. Well regions 36 and 38 have been omitted from ESD protection device 60, but well region 64 of the same conductivity type as collection region 28 and ohmic contact region 32 is shown surrounding source contact region 26 and collection region 28.

As a result, a pnpn junction is formed among source contact region 26, well region 64, semiconductor layer 62, and ohmic contact region 32. More specifically, a first bipolar transistor (either npn or pnp) is formed by source contact region 26 (emitter/collector), well region 64 (base), and semiconductor layer 62 (collector/emitter). In addition, a second bipolar transistor (either pnp or npn) is formed by ohmic contact region 32 (emitter/collector), semiconductor layer 62 (base), and well region 64 (collector/emitter). Collectively, the bipolar transistors serve as silicon controlled rectifier (SCR) 66. In particular, source contact region 26 and ohmic contact region 32 may serve as cathodes and anodes of SCR 66, respectively or vice versa, depending on the conductivity types of the regions formed within ESD protection device 60. The dotted line in FIG. 1 is used to illustrate the general connection of diffusion regions making up SCR 66 and is not intended to imply a particular boundary of the SCR.

FIG. 5 illustrates a schematic of an exemplary circuit outlining the arrangement of one or more of the ESD protection devices described herein relative to output driver transistors, signal pads, and power supply pads of the circuit. FIG. 5 illustrates circuit 70 having ESD protection device 78 arranged in parallel with LDMOS pull-down transistor 74. In such a configuration, a positive zap on high voltage signal pad 72 with respect to low power supply Vss will prompt ESD protection device 78 to trigger prior to LDMOS pull-down transistor 74 and thus divert excessive voltage on the bus common to both devices. In addition, the inclusion of ESD protection circuit 80 along the bus between high voltage power supply $V_{DD}$ and low voltage power supply Vss may divert ESD current away from pull-up LDMOS transistor 76 when a negative zap on high voltage signal pad 72 with respect to high voltage power supply $V_{DD}$ occurs.

Processing steps for making structures of the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995, 2002 (vols 1-4, respectively); Microchip Fabrication 5th. edition, Peter Van Zant, McGraw-Hill, 2004. The semiconductor devices of the present invention may be incorporated in an electronic device, for example a computer, mobile phone, an airplane or an automobile.

What is claimed is:

1. An electrostatic discharge protection device for protecting a node, comprising:
   (a) a transistor, comprising
      (i) a semiconductor substrate,
      (ii) a source region, in the substrate,
      (iii) a channel region, in the substrate, adjacent the source region,
      (iv) a gate, over the channel region, and
      (v) a drain region, in the substrate, laterally displaced from the channel,
   (b) a silicon controlled rectifier, in the substrate, comprising
      (i) the source region,
      (ii') a portion of the substrate,
      (iii') a doped well, in the substrate, and
      (iv') a first contact region, in the well, laterally displaced from the drain region,
   (c) a second contact region, in the substrate, laterally displaced from the first contact region, and
   (d) a collection region, in the substrate, adjacent the source region,
   wherein the collection region, the source region and the gate, are metallically connected,
   the node, the first contact region, and the second contact region, are metallically connected,
   the drain region is not metallically connected to the node, and
   the electrostatic discharge protection device having a trigger voltage of 12-100 volts.

2. The electrostatic discharge protection device of claim 1, having a trigger voltage of at most 20 volts.

3. The electrostatic discharge protection device of claim 1, having a trigger voltage of 15-20 volts.

4. The electrostatic discharge protection device of claim 1, wherein the drain region is laterally displaced from the channel by a distance of 0.5 to 10 microns.

5. The electrostatic discharge protection device of claim 1, wherein the drain region is laterally displaced from the channel by a distance of 1 to 3 microns.

6. The electrostatic discharge protection device of claim 1, wherein the first contact region is laterally displaced from the drain region by a distance of 0.5 to 10 microns.

7. The electrostatic discharge protection device of claim 1, wherein the first contact region is laterally displaced from the drain region by a distance of 1 to 3 microns.

8. The electrostatic discharge protection device of claim 1, wherein the second contact region is laterally displaced from the first contact region by a distance of 0.5 to 10 microns.

9. The electrostatic discharge protection device of claim 1, wherein the second contact region is laterally displaced from the first contact region by a distance of 1 to 3 microns.

10. The electrostatic discharge protection device of claim 1, wherein the second contact region is in the well.

11. The electrostatic discharge protection device of claim 1, wherein the drain region is in a second doped well.

12. The electrostatic discharge protection device of claim 11, wherein the second contact region is in the second well.

13. A circuit, comprising:
   a transistor, and
   an electrostatic discharge protection device for protecting a node, comprising:
   (a) a transistor, comprising:
      (i) a semiconductor substrate,
      (ii) a source region, in the substrate,
      (iii) a channel region, in the substrate, adjacent the source region,
      (iv) a gate, over the channel region, and
      (v) a drain region, in the substrate, laterally displaced from the channel,
   (b) a silicon controlled rectifier, in the substrate, comprising
      (i) the source region,
      (ii') a portion of the substrate,
      (iii') a doped well, in the substrate, and
      (iv') a first contact region, in the well, laterally displaced from the drain region,
   (c) a second contact region, in the substrate, laterally displaced from the first contact region, and
   (d) a collection region, in the substrate, adjacent the source region,
   wherein the collection region, the source region and the gate, are metallically connected,
   the node, the first contact region, and the second contact region, are metallically connected,
   the drain region is not metallically connected to the node, and
   the electrostatic discharge protection device having a trigger voltage of 12-100 volts.

14. The circuit of claim 13, wherein the electrostatic discharge protection device has a trigger voltage of at most 20 volts.

15. The circuit of claim 13, wherein the electrostatic discharge protection device has a trigger voltage of 15-20 volts.

16. The circuit of claim 13, wherein the transistor is a laterally diffused pull-down driver transistor or an output driver transistor with an extended drain contact region.

17. An electrostatic discharge protection device for protecting a node, comprising:
   (a) a transistor, comprising
      (i) a semiconductor substrate,
      (ii) a source region, in the substrate,
      (iii) a channel region, in the substrate, adjacent the source region
      (iv) a gate, over the channel region, and
      (v) a drain region, in the substrate, laterally displaced from the channel,
   (b) a silicon controlled rectifier, in the substrate, comprising
      (i) the source region,
      (ii') a portion of the substrate,
      (iii') a doped well, in the substrate, and
      (iv') a first contact region, in the well, laterally displaced from the drain region,
   (c) a second contact region, in the substrate, laterally displaced from the first contact region, and
   (d) a collection region, in the substrate, adjacent the source region,
   wherein the collection region, the source region and the gate, are metallically connected,
   the node, the first contact region, and the second contact region, are metallically connected,
   the drain region is not metallically connected to the node,
   the drain region is laterally displaced from the channel by a distance of 1 to 3 microns,
   the first contact region is laterally displaced from the drain region by a distance of 1 to 3 microns, and
   the second contact region is laterally displaced from the first contact region by a distance of 1 to 3 microns.

18. The electrostatic discharge protection device of claim 17, wherein the drain region is in a second doped well, and the second contact region is in the second well.

19. In an electrostatic discharge protection device for protecting a node, including (a) a transistor having a drain region laterally displaced from a channel, and a silicon controlled rectifier, the improvement comprising the drain region not being metallically connected to the node, and the electrostatic discharge protection device having a trigger voltage of at most 20 volts.

* * * * *